United States Patent
Zhang et al.

(10) Patent No.: US 12,352,799 B2
(45) Date of Patent: Jul. 8, 2025

(54) FPGA CHIP-BASED SYSTEM AND METHOD FOR DETECTING CABLE INSULATION STATE

(71) Applicant: HUIZHOU POWER SUPPLY BUREAU OF GUANGDONG POWER GRID CO., LTD., Huizhou (CN)

(72) Inventors: Daxing Zhang, Huizhou (CN); Zerong Huang, Huizhou (CN); Xingguang Yin, Huizhou (CN); Bingzi Cai, Huizhou (CN); Haoyu Yuan, Huizhou (CN); Mingming Tian, Huizhou (CN); Zeji Li, Huizhou (CN); Juhan Wang, Huizhou (CN); Yingping Yuan, Huizhou (CN); Zhenxing Wen, Huizhou (CN)

(73) Assignee: HUIZHOU POWER SUPPLY BUREAU OF GUANGDONG POWER GRID CO., LTD., Huizhou (CN)

( * ) Notice: Subject to any disclaimer, the term of this patent is extended or adjusted under 35 U.S.C. 154(b) by 0 days.

(21) Appl. No.: 18/846,020

(22) PCT Filed: Feb. 20, 2023

(86) PCT No.: PCT/CN2023/077061
§ 371 (c)(1),
(2) Date: Sep. 11, 2024

(87) PCT Pub. No.: WO2023/185311
PCT Pub. Date: Oct. 5, 2023

(65) Prior Publication Data
US 2025/0110170 A1   Apr. 3, 2025

(30) Foreign Application Priority Data
Mar. 28, 2022 (CN) .......................... 202210308342.4

(51) Int. Cl.
*G01R 31/12* (2020.01)
*G01R 31/14* (2006.01)

(52) U.S. Cl.
CPC ................................ *G01R 31/14* (2013.01)

(58) Field of Classification Search
CPC ............................ G01R 31/1272; G01R 31/14
See application file for complete search history.

(56) References Cited

U.S. PATENT DOCUMENTS

| | | | |
|---|---|---|---|
| 2002/0161542 A1* | 10/2002 | Jones | H04L 43/50 702/108 |
| 2003/0125893 A1* | 7/2003 | Furse | G01R 31/58 702/108 |

(Continued)

FOREIGN PATENT DOCUMENTS

| | | |
|---|---|---|
| CN | 101900776 A | 12/2010 |
| CN | 102435916 A | 5/2012 |

(Continued)

OTHER PUBLICATIONS

CN-107942198-A, Hui et al, Machine Translation (Year: 2018).*

(Continued)

*Primary Examiner* — Eman A Alkafawi
*Assistant Examiner* — Suresh K Rajaputra
(74) *Attorney, Agent, or Firm* — CM Law; Stephen J. Weed

(57) ABSTRACT

Provided are an FPGA chip-based system and method for detecting a cable insulation state. A cable insulation state monitoring program is started through a control switch. An FPGA chip generates a detection signal of a digital domain into a first circuit and sends the detection signal to a coupler after the detection signal is amplified by a sending circuit. The coupler injects the detection signal into a to-be-detected cable connected to the coupler. The coupler extracts a (Continued)

reflection signal from the to-be-detected cable. The FPGA chip evaluates the state of the to-be-detected cable according to the reflection signal.

9 Claims, 5 Drawing Sheets

(56) References Cited

U.S. PATENT DOCUMENTS

| | | | | |
|---|---|---|---|---|
| 2019/0229981 | A1* | 7/2019 | Chappell | G01R 31/08 |
| 2023/0375610 | A1* | 11/2023 | Sealey | G01R 31/083 |

FOREIGN PATENT DOCUMENTS

| | | | | |
|---|---|---|---|---|
| CN | 102680855 | A | | 9/2012 |
| CN | 104316834 | A | | 1/2015 |
| CN | 104977504 | A | | 10/2015 |
| CN | 107942198 | A * | | 4/2018 ............ G01R 27/02 |
| CN | 110907763 | A | | 3/2020 |
| CN | 211348501 | U | | 8/2020 |
| CN | 112067945 | A * | 12/2020 | ........... G01R 31/083 |
| CN | 112083288 | A * | 12/2020 | ............ G01R 31/08 |
| CN | 212723181 | U * | 3/2021 | ............ G01R 31/11 |
| CN | 113640635 | A | | 11/2021 |
| CN | 114397548 | A | | 4/2022 |
| KR | 101926995 | B1 | | 12/2018 |

OTHER PUBLICATIONS

CN-212723181-U, Wang et al, Machine Translation (Year: 2021).*
CN-112083288-A, Xue et al, Machine Translation (Year: 2020).*
CN-112067945-A, Xue et al, Mahcine Translation (Year: 2020).*
1st Chinese Office Action for Chinese Application No. 202210308342.4, dated May 6, 2022 (Jun. 6, 2022)—6 pages (English translation—6 pages).
2nd Chinese Office Action for Chinese Application No. 202210308342.4, dated Jul. 13, 2022 (Jul. 13, 2022)—7 pages (English translation—7 pages).
International Search Report for International Application No. PCT/CN2023/077061, dated Apr. 18, 2023 (Apr. 18, 2023)—3 pages (English translation—3 pages).

* cited by examiner

FPGA CHIP-BASED SYSTEM AND METHOD FOR DETECTING CABLE INSULATION STATE

CROSS-REFERENCES TO RELATED APPLICATIONS

This is a National Stage Application, filed under 35 U.S.C. 371, of International Patent Application No PCT/CN2023/077061, filed on Feb. 20, 2023, which is based on and claims priority to Chinese Patent Application No. 202210308342.4 filed with the China National Intellectual Property Administration (CNIPA) on Mar. 28, 2022, the disclosures of which are incorporated herein by reference in their entirety.

TECHNICAL FIELD

The present application relates to the technical field of power secondary devices, for example, an FPGA chip-based system and method for detecting a cable insulation state.

BACKGROUND

In recent years, power grid companies have undergone multiple short circuit faults caused by insulation quality lowering of power cables in substations. Since alternating and direct current cables in the substations are laid together in cable trenches, when a cable has a short circuit fault, a short-circuit current burns all the cables in the entire trench, resulting in device malfunctions and failures. Due to the long transmission distances of cables within the substations, numerous branch lines, harsh environmental and climatic conditions and device faults, it is difficult to detect defects through manual infrared temperature measurement, visual inspection and other such manners. Therefore, achieving online monitoring of the insulation of the power cables within the substations is of great significance for maintaining the safety and stability of the power grid.

Common cable insulation defects and faults include poor process or material at connectors, cable aging and cable insulation damage caused by an external force. Currently, main methods for detecting a cable fault domestically and internationally include offline distance measurement, live detection and online monitoring. The offline distance measurement method involves shutting down the power and disconnecting the power cables after a fault occurs, and then testing the fault distance by using a relevant device. This method results in prolonged power outages, impacting social and economic activities. Additionally, the offline detection method requires deploying manpower and resources to find the cause and locate the fault point after the fault has occurred, resulting in a very low efficiency. Live detection methods include a direct current component method, dielectric constant method, distributed optical fiber temperature measurement, and live detection of partial discharge. While being feasible in ideal laboratory environments, these methods often fail to provide satisfactory results in actual field applications.

SUMMARY

The present application provides a field-programmable gate array (FPGA) chip-based system and method for detecting a cable insulation state. Real-time detection can be performed by installing a detection card and a coupler at one end of a to-be-detected cable. In the present application, an FPGA chip on the detection card generates, injects, collects and analyzes a detection signal, and a signal processing algorithm result is used for identifying the insulation aging state of the to-be-detected cable, determining the type and aging degree of each insulation aging point and achieving the online monitoring of insulation states of cables used in substations.

The present application provides an FPGA chip-based system for detecting a cable insulation state. The system includes a detection card and a coupler, where the detection card includes an FPGA chip, and a first circuit and a second circuit that are connected to the FPGA chip.

The FPGA chip includes a logic control module and a detection signal generation module that are connected in series to the first circuit, and a synchronization module, a noise reduction module, a signal processing module and a state evaluation module that are connected in series to the second circuit.

The first circuit is configured to send a detection signal generated by the detection signal generation module to the coupler, the coupler is configured to: inject the detection signal into a to-be-detected cable connected to the coupler, extract a reflection signal from the to-be-detected cable and send the reflection signal to the state evaluation module through the second circuit to evaluate a state of the to-be-detected cable.

The present application further provides an FPGA chip-based method for detecting a cable insulation state. The method includes the steps below.

A control switch is set to 1, and a cable insulation state monitoring program is started.

An FPGA chip generates a first detection signal of a digital domain and transfers the first detection signal to a first circuit.

A digital-to-analog converter (DAC) converts the first detection signal to a first simulation signal and sends the first simulation signal to a coupler after the first simulation signal is amplified by a sending circuit, and the coupler injects the first simulation signal into a to-be-detected cable connected to the coupler.

The coupler extracts a reflection signal from the to-be-detected cable and transfers the reflection signal to a second circuit.

After a receiving circuit filters and amplifies the acquired reflection signal, an analog-to-digital converter (ADS) converts the first simulation signal to a second detection signal of the digital domain and sends the second detection signal to the FPGA chip.

The FPGA chip evaluates a state of the to-be-detected cable according to the reflection signal.

A state evaluation result of the to-be-detected cable is displayed at a liquid crystal screen end, the control switch is set to 0 and, the cable insulation state monitoring program is ended.

DETAILED DESCRIPTION

For a better understanding of technical solutions in the present application by those skilled in the art, the technical solutions in embodiments of the present application are described clearly and completely. Apparently, the embodiments described below are part, not all, of embodiments of the present application. Based on the embodiments of the present application, all other embodiments obtained by those of ordinary skill in the art without creative work are within the scope of the present application.

Figure 1:
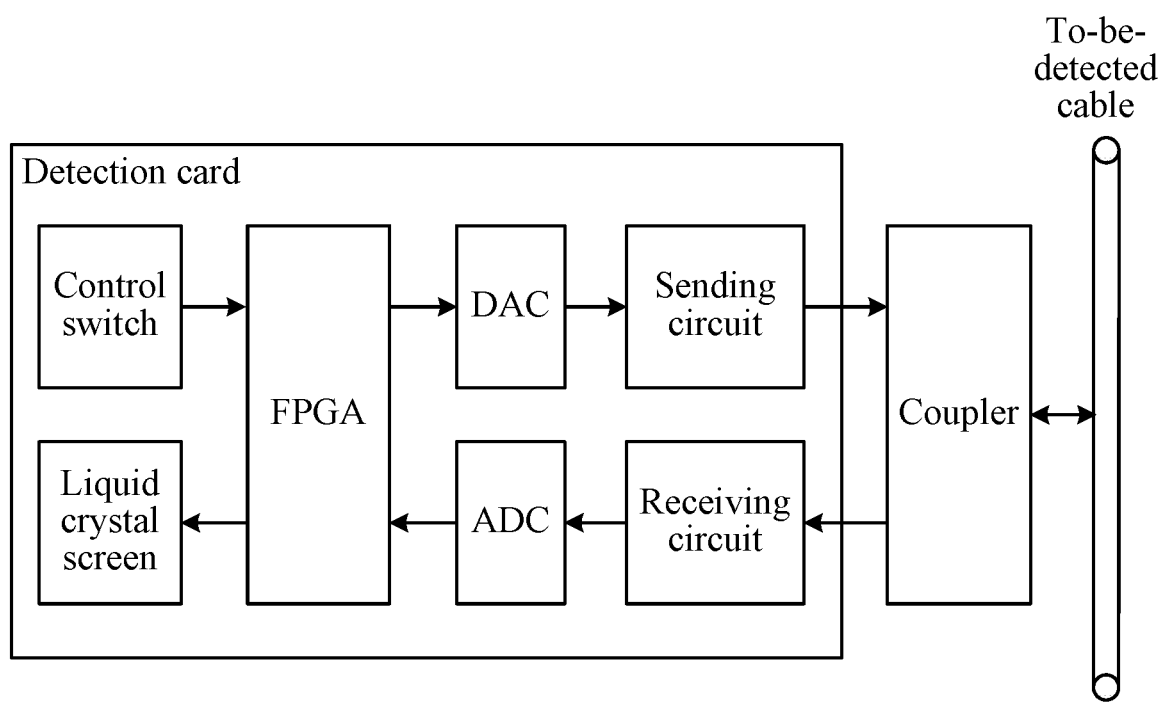
FIG. 1 is a diagram illustrating an FPGA chip-based system for detecting a cable insulation state.

As shown in FIG. 1, the present application provides a field-programmable gate array (FPGA) chip-based system for detecting a cable insulation state. The system includes a detection card and a coupler. The detection card mainly includes a control switch, an FPGA chip, a first circuit, a second circuit and a liquid crystal screen.

For example, both the first circuit and the second circuit are connected to the FPGA chip.

The FPGA chip includes a logic control module and a detection signal generation module that are connected in series to the first circuit, and a synchronization module, a noise reduction module, a signal processing module and a state evaluation module that are connected in series to the second circuit, and a read-only memory (ROM) module.

The first circuit is configured to send a detection signal generated by the detection signal generation module to the coupler, the coupler is configured to: inject the detection signal into a to-be-detected cable connected to the coupler, extract a reflection signal from the to-be-detected cable and send the reflection signal to the state evaluation module through the second circuit to evaluate the state of the to-be-detected cable.

The first circuit at least includes a digital-to-analog converter (DAC) and a sending circuit. The digital-to-analog converter (DAC) converts a digital domain signal from the detection signal generation module to a simulation domain signal and sends the simulation domain signal to the coupler after the simulation domain signal is amplified by the sending circuit.

The second circuit at least includes a receiving circuit and an analog-to-digital converter (ADC). After the receiving circuit amplifies the acquired reflection signal, the analog-to-digital converter (ADC) converts the simulation domain signal to the digital domain signal and sends the digital domain signal to the synchronization module.

Figure 2:
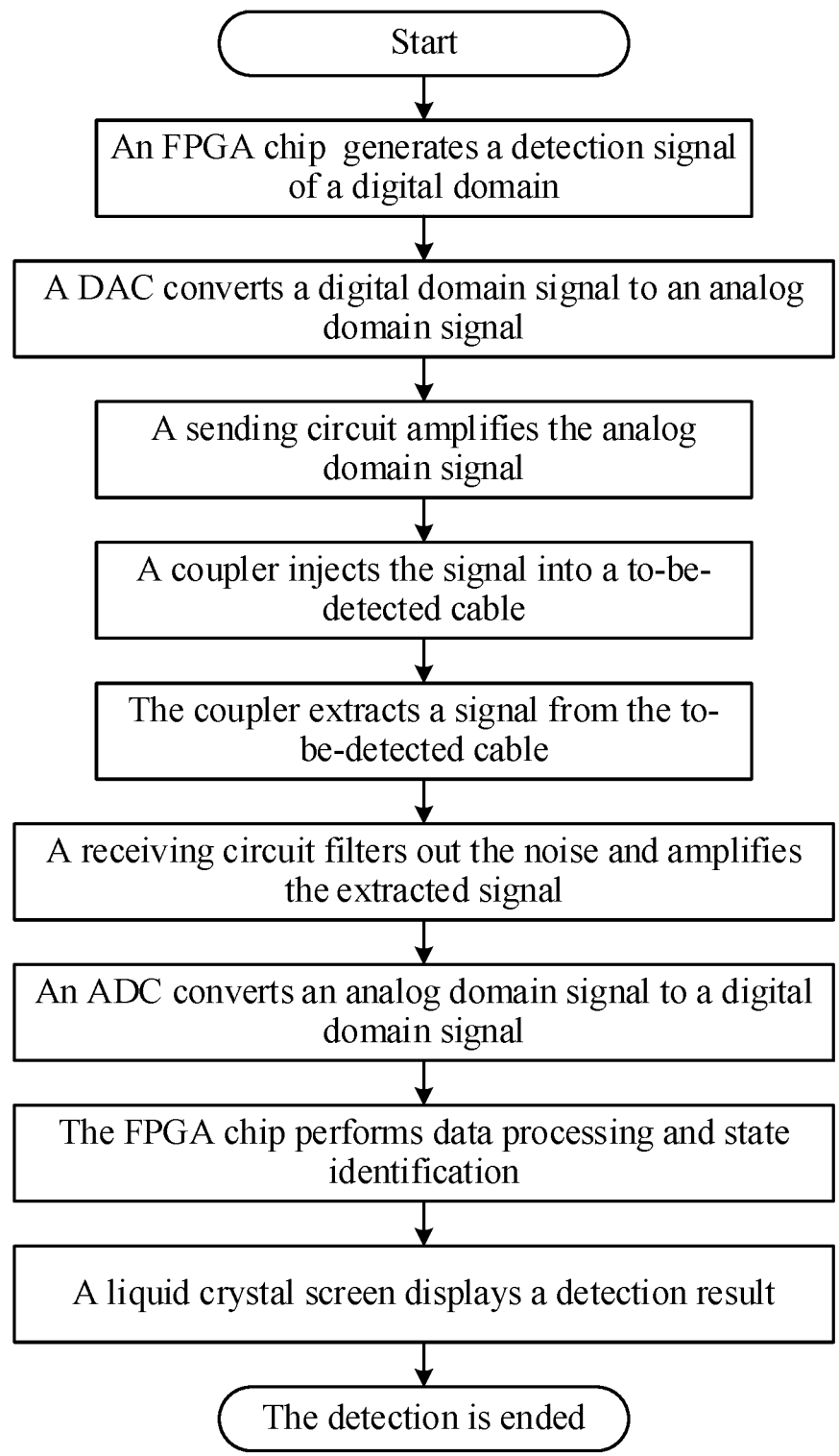
FIG. 2 is an operating flowchart of a system for detecting a cable insulation state according to the present application.

As shown in FIG. 2, the operating flowchart of an FPGA chip-based system for detecting a cable insulation state according to the present application mainly includes the steps below.

In S1, a control switch is in an off state, and a cable insulation state detection flow is started.

In S2, an FPGA chip generates a detection signal of a digital domain.

In S3, a digital-to-analog converter (DAC) converts the detection signal of the digital domain to a simulation signal.

In S4, an amplification circuit amplifies the simulation signal.

In S5, a coupler injects the amplified simulation signal into a to-be-detected cable.

In S6, the coupler extracts a simulation signal from the to-be-detected cable.

In S7, a receiving circuit filters and amplifies the extracted simulation signal.

In S8, an analog-to-digital converter (ADC) converts the simulation signal to a digital signal.

In S9, the FPGA chip performs data processing on a collected reflection signal, determines the cable insulation state according to a processing result and sends a determination result to a liquid crystal screen.

In S10, the liquid crystal screen displays a detection result.

In S11, the detection is ended.

Figure 3:
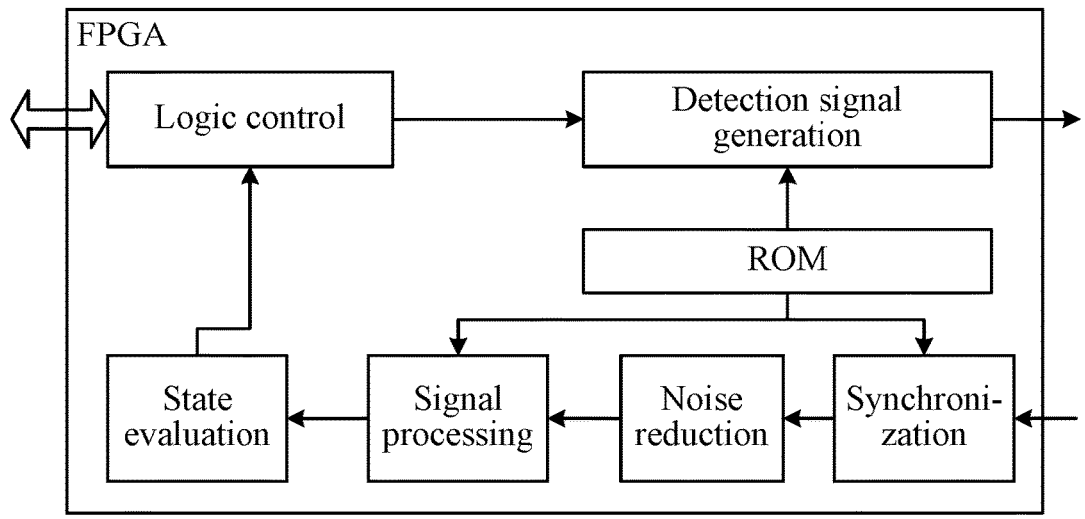
FIG. 3 is a diagram illustrating the structure of an internal logic circuit of an FPGA according to the present application.

FIG. 3 is a diagram illustrating the structure of an internal logic circuit of an FPGA. The internal logic circuit of the FPGA mainly includes a logic control module, a detection signal generation module, a ROM module, a synchronization module, a noise reduction module, a signal processing module, a state evaluation module and other modules. The logic control module is responsible for the timing control, external interface and other functions of the internal logic of the entire FPGA. The logic control module is connected to the external control switch to monitor the on-off state of the control switch. Once the logic control module monitors that the control switch is in an off state, the cable insulation state detection flow is started, and a pulse signal is generated to instruct the detection signal generation module to start working. For example, the logic control module is also connected to the external liquid crystal screen and outputs the detection result of the cable insulation state output by the state evaluation module to the liquid crystal screen for display.

After being started, the detection signal generation module reads a training sequence from the ROM module, where the number of times of reading is M. The read training sequence is used as a detection signal of the cable insulation state and injected into a to-be-detected cable connected to a first circuit through the first circuit.

The ROM module stores the training sequence whose length is N and whose bit width is B, where N≥128, and B≥10 bits. The ROM module is configured to provide the training sequence for the detection signal generation module, the synchronization module and the signal processing module.

Figure 4:
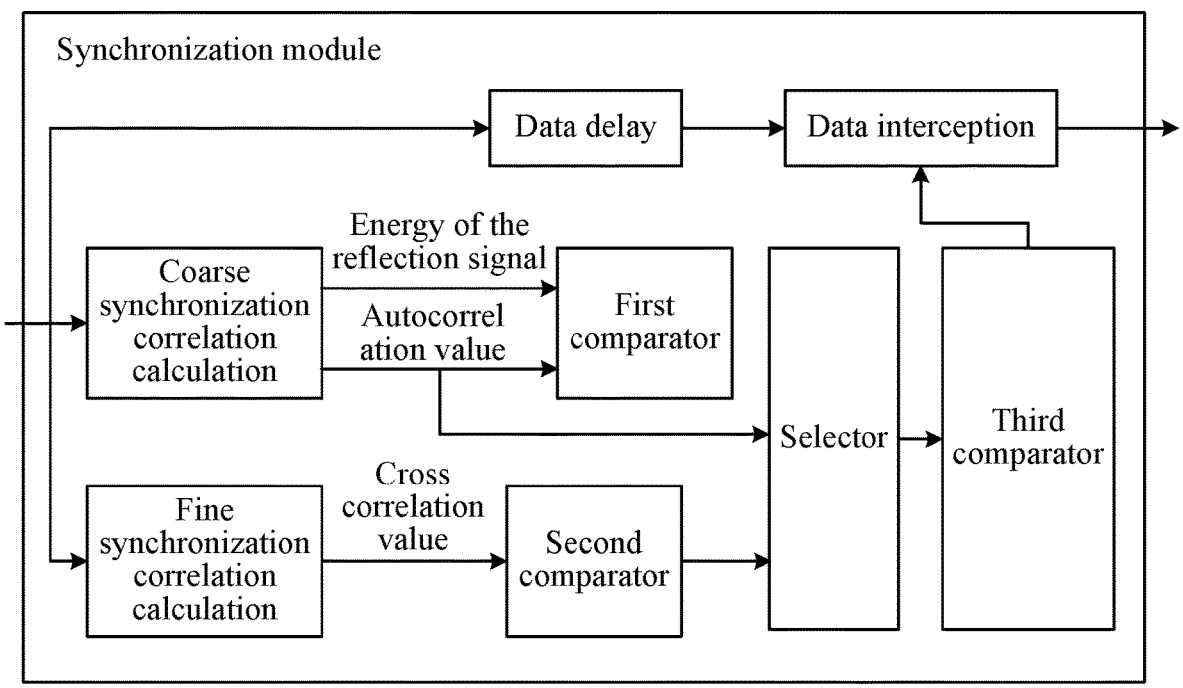
FIG. 4 is a diagram illustrating the internal logic structure of a synchronization module according to the present application.

After receiving the reflection signal from a second circuit, the synchronization module performs synchronous data processing on the reflection signal. As shown in FIG. 4, the internal logic structure of the synchronization module mainly includes a coarse synchronization correlation calculation module, a fine synchronization correlation calculation module, a first comparator, a second comparator, a third comparator, a selector, a data delay module and a data interception module. The coarse synchronization correlation calculation module calculates the energy of the reflection signal and an autocorrelation value. The fine synchronization correlation calculation module calculates a cross-correlation value of the reflection signal and the training sequence in the ROM module.

The first comparator compares the two output signals of the coarse synchronization correlation calculation module. If the correlation value is greater than the energy of the input signal, this indicates that coarse synchronization is locked, and an instruction signal 1 is generated simultaneously.

The second comparator compares the cross-correlation value calculated by the fine synchronization correlation calculation module with a preset threshold value. If the cross-correlation value is greater than the preset threshold value, this indicates that fine synchronization is locked, and an instruction signal 2 is generated simultaneously.

The third comparator determines whether the output of the selector is positive or negative. If the output of the selector module is negative, this indicates that timing synchronization is locked, and an instruction signal 3 is generated simultaneously. If the output of the selector module is positive, no signal is output.

The data delay module performs delay on input signal data, where the delay duration is the data processing duration of the synchronization module, and the delayed data is used as an input signal of the data interception module. After detecting the instruction signal 3, the data interception module starts outputting a signal whose length is N*M, where N denotes the length of the training sequence stored in the ROM module, and M denotes the number of times of ROM data read by the detection signal generation module.

Figure 5:
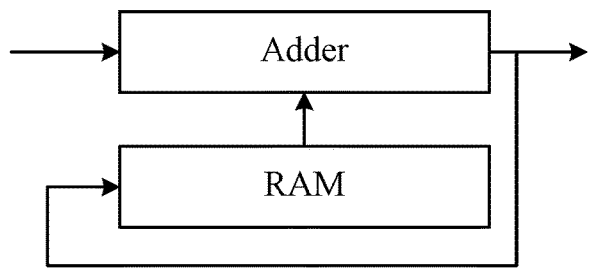
FIG. 5 is a diagram illustrating the internal logic structure of a noise reduction module according to the present application.

The noise reduction module is mainly to increase the useful signal energy in a collection signal to increase the signal-to-noise ratio. As shown in FIG. 5, the internal logic structure of the noise reduction module mainly includes an adder and a random-access memory (RAM). The adder completes an addition operation. The storage depth of the RAM is N, and the storage width of the RAM is B.

Figure 6:
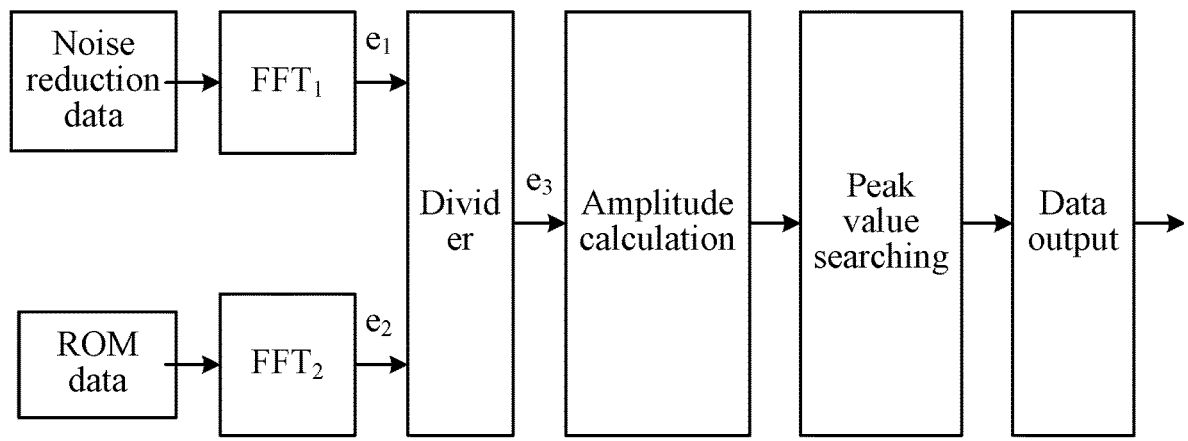
FIG. 6 is a diagram illustrating the internal logic structure of a signal processing module according to the present application.

As shown in FIG. 6, the internal logic structure of the signal processing module includes two fast Fourier transform (FFT) modules, a divider, an amplitude calculation module, a peak value searching module and a data output module. One of two inputs of the signal processing module is an output signal sequence of the noise reduction module, and the output signal sequence has the length of N and is sent to an FFT1 module to convert a time domain signal to a frequency domain signal; the other one of the two inputs of the signal processing module is an output signal sequence of the ROM module. The output signal sequence also has the length of N and is sent to an FFT2 module to convert a time domain signal to a frequency domain signal. The divider completes a division operation. The length of the output sequence is N. After the amplitude of the output sequence is calculated, an element having the second largest peak value is searched, and the serial number idx of the element is recorded. According to the serial number, the data output module outputs data $e_3(idx)$ to the state evaluation module for determining the cable insulation state.

Figure 7:
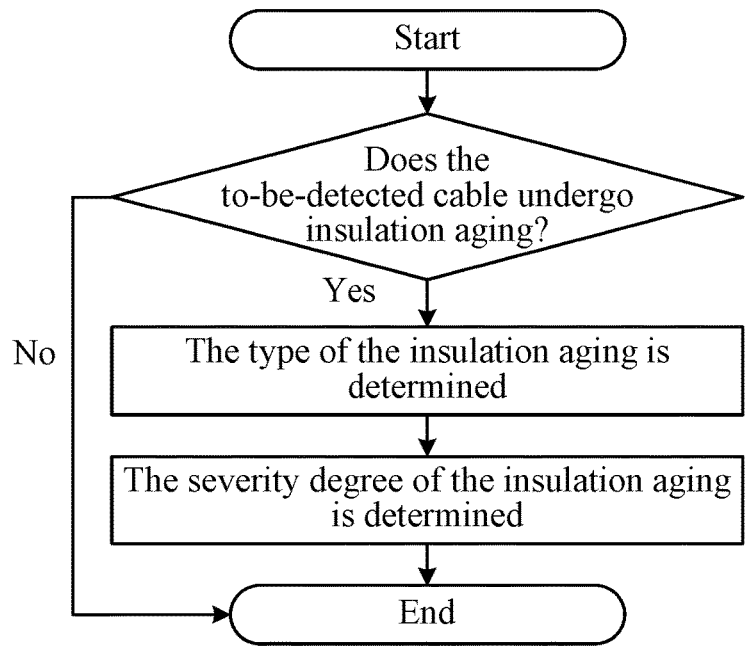
FIG. 7 is an operating flowchart of a state evaluation module according to the present application.

According to the output of the signal processing module, the state evaluation module determines the insulation state of the to-be-detected cable. As shown in FIG. 7, the state evaluation module determines, according to the output data $e_3(idx)$, whether the to-be-detected cable undergoes insulation aging. If the to-be-detected cable undergoes the insulation aging, the type of the insulation aging and the degree of the insulation aging are determined; otherwise, if the to-be-detected cable undergoes no insulation aging, the state evaluation is ended.

For example, the state evaluation module is connected to a liquid crystal screen and configured to display a state evaluation result of the to-be-detected cable.

The present application further provides an FPGA chip-based method for detecting a cable insulation state. The method includes the steps below.

In S11, a control switch is set to 1, and a cable insulation state monitoring program is started.

In S12, an FPGA chip generates a detection signal of a digital domain and transfers the detection signal to a first circuit.

In S13, a digital-to-analog converter (DAC) converts the detection signal of the digital domain to a simulation signal and sends the simulation signal to a coupler after the simulation signal is amplified by a sending circuit, and the coupler injects the simulation signal into a to-be-detected cable connected to the coupler.

In S14, the coupler extracts a reflection signal from the to-be-detected cable and transfers the reflection signal to a second circuit.

In S15, after a receiving circuit filters and amplifies the acquired reflection signal, an analog-to-digital converter (ADS) converts the simulation signal to the detection signal of the digital domain and sends the detection signal to the FPGA chip.

In S16, the FPGA chip evaluates the state of the to-be-detected cable according to the reflection signal.

In S17, a state evaluation result of the to-be-detected cable is displayed at a liquid crystal screen end, the control switch is set to 0, and the cable insulation state monitoring program is ended.

Figure 8:
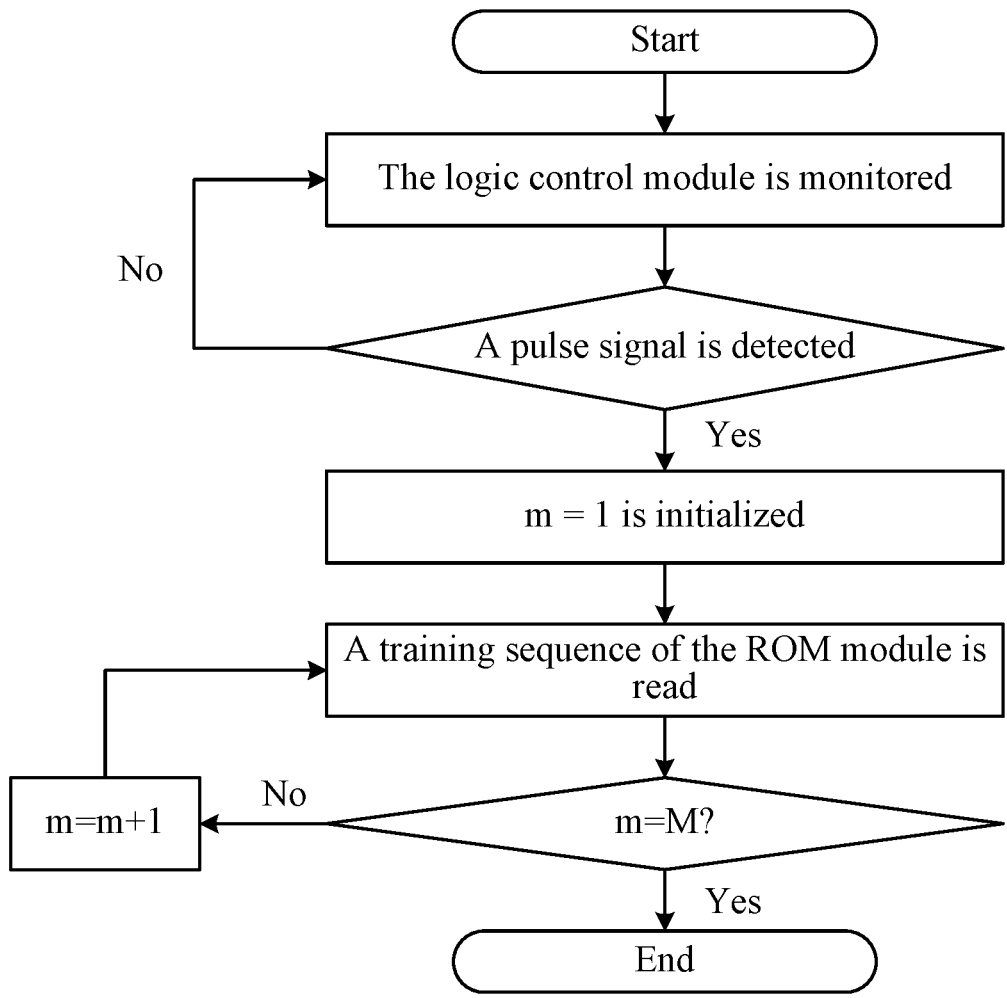
FIG. 8 is an operating flowchart of a detection signal generation module according to the present application.

As shown in FIG. 8, S12 in which the FPGA chip generates the detection signal includes the steps below.

In S121, when a logic control module receives a start signal from the control switch, the cable insulation state detection program is started, and a pulse signal is generated to instruct a detection signal generation module to start running; when the detection signal generation module detects the pulse signal, the method goes to S122; otherwise, the detection signal generation module keeps running until the pulse signal is continuously detected.

In S122, m is initialized with m=1, where m denotes the number of times of reading.

In S123, the detection signal generation module starts reading a training sequence from a ROM module.

In S124, whether m equals to M is determined; if m=M is satisfied, the detection signal generation module stops running; otherwise, the operation of m=m+1 is performed, the method goes to S123.

S16 in which the FPGA chip evaluates the state of the to-be-detected cable according to the reflection signal includes the steps below.

In S161, a synchronization module performs a logical operation on the reflection signal and sends, after the reflection signal is processed by a noise reduction module, the reflection signal to an FFT1 module for signal processing; an FFT2 module simultaneously acquires an output signal sequence of the ROM module for signal processing.

In S162, a divider processes output results of the FFT1 module and the FFT2 module, where the calculation formula is:

$$e_3(i) = \frac{e_1(i)}{e_2(i)} i = 1, 2, \ldots, N.e_3(i)$$

denotes an i-th element in an output sequence of the divider, $e_1(i)$ denotes an i-th element in an output sequence of the FFT1 module, $e_2(i)$ denotes an i-th element in an output sequence of the FFT2 module, and N denotes the length of the output sequences.

Since the output of the divider is a complex signal having a real part and an imaginary part and cannot be compared directly, the amplitude of the complex signal is required to be first calculated.

In S163, amplitude calculation is performed, an element having the second largest peak value is searched, the serial number idx of the element is recorded, and data $e_3(idx)$ is output to a state evaluation module, where an element having the largest amplitude corresponds to a reflection signal at a point at which a detection card is injected into the to-be-detected cable; an element having the second largest amplitude corresponds to a reflection signal of the injected detection signal at an insulation aging point. Thus, the element having the second largest amplitude is searched.

In S164, the state evaluation module determines, according to the output data $e_3(idx)$, whether the to-be-detected cable undergoes insulation aging, and the formula is:

$$H_1 = \begin{cases} \text{insulation aging exists} & |e_3(idx)| \geq T \\ \text{non insulation aging exists} & |e_3(idx)| < T \end{cases};$$

if the to-be-detected cable undergoes the insulation aging, the type of the insulation aging is determined, and the formula is:

$$H_2 = \begin{cases} \text{low-resistance insulation aging} & e_3(idx) < 0 \\ \text{high-resistance insulation aging} & e_3(idx) > 0 \end{cases};$$

the degree of the insulation aging is determined, and the formula is:

$$H_3 = \text{floor}\left(\frac{|e_3(idx) \cdot 2^Q|}{THR}\right);$$

otherwise, if the to-be-detected cable undergoes no insulation aging, the state evaluation is ended.

$H_1$ denotes the cable insulation state, T denotes a threshold value, |x| denotes the amplitude of x, and $H_2$ denotes types of cable insulating aging; when $e_3(idx)$ is greater than 0, the to-be-detected cable undergoes high-resistance insulation aging; when $e_3(idx)$ is less than 0, the to-be-detected cable undergoes low-resistance insulation aging. $H_3$ denotes the type of quantified insulation aging and is denoted by Q bits, THR denotes a quantization reference, and floor(x) denotes the largest integer less than x.

That the synchronization module performs the logical operation on the reflection signal includes a step below.

A coarse synchronization correlation calculation module and a fine synchronization correlation calculation module perform data processing on the reflection signal after receiving the reflection signal sent by the analog-to-digital converter (ADS), and a data delay module simultaneously performs delay on input signal data, where the delay duration is the data processing duration of the coarse synchronization correlation calculation module and the fine synchronization correlation calculation module; the delayed data is used as an input signal of a data interception module.

The coarse synchronization correlation calculation module calculates the energy of the reflection signal and an autocorrelation value, and whether the autocorrelation value is greater than the energy of the reflection signal is determined through a first comparator; if the autocorrelation value is greater than the energy of the reflection signal, coarse synchronization is locked, and an instruction signal 1 is generated simultaneously; if the autocorrelation value is less than the energy of the reflection signal, the coarse synchronization is not locked.

The fine synchronization correlation calculation module calculates a cross-correlation value of the reflection signal and the training sequence in the ROM module, and whether the cross-correlation value is greater than a preset threshold value is determined through a second comparator; if the cross-correlation value is greater than the preset threshold value, fine synchronization is locked, and an instruction signal 2 is generated simultaneously; if the cross-correlation value is less than the preset threshold value, the fine synchronization is not locked.

After acquiring the instruction signal 2, the selector chooses to use the autocorrelation value of the coarse synchronization correlation calculation module as an input value of a third comparator, and whether the input value is positive or negative is determined through the third comparator; if the input value is negative, timing synchronization is locked, and an instruction signal 3 is generated simultaneously; if the input value is positive, no signal is output.

After detecting the instruction signal 3, the data interception module starts outputting a signal to the noise reduction module. An input data sequence of the noise reduction module is set as that A={$a_{11}$, $a_{12}$, . . . , $a_{1N}$, $a_{21}$, $a_{22}$, . . . , $a_{2N}$, . . . , $a_{M1}$, $a_{M2}$, . . . , $a_{MN}$}.

An output data sequence of the noise reduction module is that C={$c_1$, $c_2$, . . . , $c_N$}, and the noise reduction module performs processing by using a formula below:

$$c_i = \sum_{j=1}^{M} a_{ij} \quad i = 1, 2, \ldots N.$$

$c_i$ denotes an i-th element in the output data sequence C, and $a_{ij}$ denotes ((i−1)*N+j)-th element in the input data sequence A.

The coarse synchronization correlation calculation module is configured to calculate the energy of the input signal and the autocorrelation value and connected to the first comparator. The fine synchronization correlation calculation module is configured to calculate the cross-correlation value of the input signal and the training sequence in the ROM module and connected to the second comparator. Both the first comparator and the second comparator are connected to the selector, and the selector is connected to the third comparator. The data delay module performs delay on the input signal data, where the delay duration is the data processing duration of the synchronization module, and the delayed data is used as the input signal of the data interception module. The data interception module starts outputting the signal to the noise reduction module in response to an instruction signal sent by the third comparator.

The present application provides the system and method for detecting a cable insulation state. This method can not only determine whether the cables used in the substations undergo insulation state aging but also provide the type of each aging point and the aging degree of the each aging point. This facilitates a comprehensive assessment of the cable insulation state and provides a more reliable and accurate basis for cable monitoring and maintenance in the substations.

Additionally, the system and method for detecting a cable insulation state provided in the present application are based on the FPGA chip. This can rapidly upgrade a collection signal processing algorithm and a cable state identification algorithm and features a simple principle, cost-effectiveness and ease of application.

The main core of the system for detecting a cable insulation state provided in the present application is based on the FPGA chip. Based on the FPGA chip, a comprehensive and directional evaluation of the cable insulation state can be completed, and subsequent algorithm iteration and upgrading can be facilitated. Without adding an additional hardware device, cables in medium-and-low-voltage distribution networks can be monitored online. This system features a simple principle, cost-effectiveness and ease of application.

What is claimed is:

1. A field-programmable gate array (FPGA) chip-based system for detecting a cable insulation state, comprising a detection card and a coupler;
   wherein the detection card comprises an FPGA chip, and a first circuit and a second circuit that are connected to the FPGA chip;
   wherein the FPGA chip comprises a logic control module and a detection signal generation module that are connected in series to the first circuit, and a synchronization module, a noise reduction module, a signal processing module and a state evaluation module that are connected in series to the second circuit;
   wherein the synchronization module comprises a coarse synchronization correlation calculation module, a fine synchronization correlation calculation module and a data delay module;
   wherein the coarse synchronization correlation calculation module is configured to calculate an energy of a reflection signal and an autocorrelation value, and the coarse synchronization correlation calculation module is connected to a first comparator;
   the fine synchronization correlation calculation module is configured to calculate a cross-correlation value of the reflection signal and a training sequence in a read only memory (ROM) module, and the fine synchronization correlation calculation module is connected to a second comparator;
   the first comparator and the second comparator are connected to a selector separately, and the selector is connected to a third comparator,
   the data delay module is configured to perform delay on input signal data and use the delayed data as an input signal of a data interception module, and a delay duration is a data processing duration of the synchronization module;
   the data interception module is configured to output a signal to the noise reduction module in response to an instruction signal sent by the third comparator; and
   wherein the first circuit is configured to send a detection signal generated by the detection signal generation module to the coupler, the coupler is configured to: inject the detection signal into a to-be-detected cable connected to the coupler, extract the reflection signal from the to-be-detected cable and send the reflection signal to the state evaluation module through the second circuit to evaluate a state of the to-be-detected cable.

2. The system according to claim 1, wherein
   the first circuit comprises a digital-to-analog converter (DAC) and a sending circuit, wherein the DAC converts a digital domain signal from the detection signal generation module to a simulation domain signal and sends the simulation domain signal to the coupler after the simulation domain signal is amplified by the sending circuit; and
   the second circuit comprises a receiving circuit and an analog-to-digital converter (ADC), wherein after the receiving circuit amplifies the reflection signal, the ADC converts a simulation domain signal to a digital domain signal and sends the digital domain signal to the synchronization module.

3. The system according to claim 2, wherein the FPGA chip further comprises the ROM module configured to store the training sequence, a storage length of the training sequence is N and a bit width of the training sequence is B, wherein N≥128, and B≥10 bits; and
   the ROM module is configured to provide the training sequence for the detection signal generation module, the synchronization module and the signal processing module.

4. The system according to claim 3, wherein the logic control module is connected to a control switch through an external interface, and the logic control module is configured to, in response to determining that the control switch is in an off state, start a cable insulation state detection program and generate a pulse signal to instruct the detection signal generation module to start running; and
   the detection signal generation module is configured to read the training sequence from the ROM module, and the number of times of reading is M.

5. The system according to claim 4, wherein the noise reduction module comprises an adder and a random-access memory (RAM), the adder is configured to output the signal to the signal processing module after completing an addition operation;
   the signal processing module comprises a fast Fourier transform (FFT)1 module, an FFT2 module, a divider, an amplitude calculation module, a peak value searching module and a data output module;
   wherein the FFT1 module is configured to receive a signal of the adder for signal processing, the FFT2 module is configured to acquire an output signal sequence of the ROM module for signal processing;
   the divider is configured to process output results of the FFT1 module and the FFT2 module, transfer the processed output results to the amplitude calculation module and the peak value searching module for processing, and processed results are sent by the data output module to the state evaluation module; and
   the state evaluation module is connected to a liquid crystal screen and configured to display a state evaluation result of the to-be-detected cable.

6. A field-programmable gate array (FPGA) chip-based method for detecting a cable insulation state, performed by the system of claim 1, comprising:
   setting a control switch to 1 and starting a cable insulation state monitoring program;
   generating, by an FPGA chip, a first detection signal of a digital domain and transferring the first detection signal to a first circuit;
   converting, by a digital-to-analog converter (DAC), the first detection signal to a first simulation signal, sending, by the DAC, the first simulation signal to a coupler after the first simulation signal is amplified by a sending circuit, and injecting, by the coupler, the first simulation signal into a to-be-detected cable connected to the coupler;

extracting, by the coupler, a reflection signal from the to-be-detected cable and transferring the reflection signal to a second circuit;

converting, by an analog-to-digital converter (ADS), the first simulation signal to a second detection signal of the digital domain after a receiving circuit filters and amplifies the reflection signal and sending, by the ADS, the second detection signal to the FPGA chip;

evaluating, by the FPGA chip, a state of the to-be-detected cable according to the reflection signal; and displaying a state evaluation result of the to-be-detected cable at a liquid crystal screen end, setting the control switch to 0 and ending the cable insulation state monitoring program.

7. The method according to claim 6, wherein the generating, by the FPGA chip, the first detection signal of the digital domain into the first circuit comprises:

in response to determining that a logic control module receives a start signal from the control switch, starting a cable insulation state detection program and generating a pulse signal to instruct a detection signal generation module to start running;

initializing a value of m with m=1, wherein m denotes the number of times of reading;

starting reading, by the detection signal generation module, a training sequence from a read-only memory (ROM) module; and determining whether m=M is satisfied, ending running of the detection signal generation module when m=M is satisfied, and starting reading, by the detection signal generation module, the training sequence from the ROM module when m=M is not satisfied.

8. The method according to claim 7, wherein the evaluating, by the FPGA chip, the state of the to-be-detected cable according to the reflection signal comprises:

performing, by a synchronization module, a logical operation on the reflection signal and sending, after the reflection signal is processed by a noise reduction module, the reflection signal to a fast Fourier transform (FFT)1 module for signal processing;

simultaneously acquiring, by an FFT2 module, an output signal sequence of the ROM module for signal processing;

processing, by a divider, output results of the FFT1 module and the FFT2 module by using a calculation formula, wherein the calculation formula is:

$$e_3(i) = \frac{e_1(i)}{e_2(i)} i = 1, 2, \ldots, N;$$

wherein $e_3(i)$ denotes an i-th element in an output sequence of the divider, $e_1(i)$ denotes an i-th element in an output sequence of the FFT1 module, $e_2(i)$ denotes an i-th element in an output sequence of the FFT2 module, and N denotes a length of the output sequences;

performing an amplitude calculation, searching an element having a second largest peak value, recording a serial number idx of the second largest element and outputting data $e_3(idx)$ to a state evaluation module;

determining, by the state evaluation module according to the output data $e_3(idx)$, whether the to-be-detected cable undergoes insulation aging by using a formula, wherein the formula is:

$$H_1 = \begin{cases} \text{insulation aging exists} & |e_3(idx)| \geq T \\ \text{non insulation aging exists} & |e_3(idx)| < T \end{cases};$$

in response to determining that the to-be-detected cable undergoes the insulation aging, determining a type of the insulation aging and a degree of the insulation aging by using formulas, wherein the formulas are:

$$H_2 = \begin{cases} \text{low-resistance insulation aging} & e_3(idx) < 0 \\ \text{high-resistance insulation aging} & e_3(idx) > 0 \end{cases} \text{ and}$$

$$H_3 = \text{floor}\left(\frac{|e_3(idx) \cdot 2^Q|}{THR}\right);$$

and ending the state evaluation in response to determining that the to-be-detected cable undergoes no insulation aging;

wherein $H_1$ denotes the cable insulation state, T denotes a threshold value, |x| denotes an amplitude of x, and $H_2$ denotes types of cable insulating aging;

in response to determining that $e_3(idx)$ is greater than 0, determining that the to-be-detected cable undergoes high-resistance insulation aging;

in response to determining that $e_3(idx)$ is less than 0, determining that the to-be-detected cable undergoes low-resistance insulation aging, wherein $H_3$ denotes a degree of quantified insulation aging and is denoted by Q bits, THR denotes a quantization reference, and floor(x) denotes a largest integer less than x.

9. The method according to claim 8, wherein the performing, by the synchronization module, the logical operation on the reflection signal comprises:

performing, by a coarse synchronization correlation calculation module and a fine synchronization correlation calculation module, data processing on the reflection signal after receiving the reflection signal sent by the analog-to-digital converter (ADS) and simultaneously performing, by a data delay module, delay on input signal data, wherein a delay duration is a data processing duration of the coarse synchronization correlation calculation module and the fine synchronization correlation calculation module; using the delayed data as an input signal of a data interception module, wherein the coarse synchronization correlation calculation module calculates an energy of the reflection signal and an autocorrelation value, and whether the autocorrelation value is greater than the energy of the reflection signal is determined through a first comparator;

in response to determining that the autocorrelation value is greater than the energy of the reflection signal, first synchronization is determined to be locked, and a first instruction signal is generated simultaneously; in response to determining that the autocorrelation value is less than the energy of the reflection signal, the first synchronization is determined to be not locked;

wherein the fine synchronization correlation calculation module calculates a cross-correlation value of the reflection signal and the training sequence in the ROM module, and whether the cross-correlation value is greater than a preset threshold value is determined through a second comparator;

in response to determining that the cross-correlation value is greater than the preset threshold value, second synchronization is determined to be locked, and a second instruction signal is generated simultaneously; in response to determining that the cross-correlation value is less than the preset threshold value, the second synchronization is determined to be not locked;

wherein after acquiring the second instruction signal, a selector module chooses to use the autocorrelation value of the coarse synchronization correlation calculation module as an input value of a third comparator, and whether the input value is positive or negative is determined through the third comparator; in response to determining that the input value is negative, timing synchronization is determined to be locked, and a third instruction signal is generated simultaneously; in response to determining that the input value is positive, no signal is output; and wherein after detecting the third instruction signal, the data interception module starts outputting a signal to the noise reduction module, an input data sequence of the noise reduction module is preset as that $A=\{a_{11}, a_{12}, \ldots, a_{1N}, a_{21}, a_{22}, \ldots, a_{2N}, \ldots, a_{M1}, a_{M2}, \ldots, a_{MN}\}$, an output data sequence of the noise reduction module is that $C=\{c_1, c_2, \ldots, c_N\}$, and the noise reduction module performs processing by using a formula below:

$$c_i = \sum_{j=1}^{M} a_{ij}\ i = 1, 2, \ldots N,$$

wherein $c_i$ denotes an i-th element in the output data sequence C, and $a_{ij}$ denotes ((i−1)*N+j)-th element in the input data sequence A.

* * * * *